United States Patent
Wang et al.

(10) Patent No.: US 8,106,658 B2
(45) Date of Patent: Jan. 31, 2012

(54) IDENTIFICATION CODE CIRCUIT FOR RECEIVING COIL IN MAGNETIC RESONANCE IMAGING SYSTEM

(75) Inventors: Jian Min Wang, ShenZhen (CN); Hua Bin Zhu, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 552 days.

(21) Appl. No.: 12/361,712

(22) Filed: Jan. 29, 2009

(65) Prior Publication Data

US 2009/0189744 A1    Jul. 30, 2009

(30) Foreign Application Priority Data

Jan. 29, 2008   (CN) .......................... 2008 1 0004200

(51) Int. Cl.
*G01V 3/00*   (2006.01)
(52) U.S. Cl. ....................................... 324/322; 324/300
(58) Field of Classification Search .......... 324/300–322; 600/607–445
See application file for complete search history.

(56) References Cited

U.S. PATENT DOCUMENTS

| | | | |
|---|---|---|---|
| 6,369,465 B1 * | 4/2002 | Swanson | 307/112 |
| 6,428,537 B1 * | 8/2002 | Swanson et al. | 606/41 |
| 7,715,894 B2 * | 5/2010 | Dunseath et al. | 600/383 |
| 2005/0079132 A1 * | 4/2005 | Wang et al. | 424/1.11 |
| 2005/0240100 A1 * | 10/2005 | Wang et al. | 600/431 |
| 2005/0244337 A1 * | 11/2005 | Wang et al. | 424/9.36 |
| 2011/0212090 A1 * | 9/2011 | Pedersen et al. | 424/133.1 |

* cited by examiner

*Primary Examiner* — Brij Shrivastav
(74) *Attorney, Agent, or Firm* — Schiff Hardin LLP

(57) ABSTRACT

An identification code circuit for a receiving coil in a magnetic resonance imaging system, is embodied in a main coil. The circuit has a fixed resistance for generating the identification code of the main coil. The main coil has a socket for connecting a sub-coil, so that a coil plug of a sub-coil can be plugged into the socket for connecting to the main coil. The identification code circuit also has a regulating resistance and a sub-coil switch corresponding to the socket. The coil plug of the sub-coil is plugged into the socket to close the sub-coil switch, so that the values of the regulating resistance and said fixed resistance are added together to form a combined resistance value. After said main coil has been connected to a magnetic resonance imaging system, an identification code source voltage value across the combined resistance value is the identification code of the combined main coil and sub-coil. A receiving circuit identification code thus can be generated simply and with reduced cost.

8 Claims, 4 Drawing Sheets

IDENTIFICATION CODE CIRCUIT FOR RECEIVING COIL IN MAGNETIC RESONANCE IMAGING SYSTEM

BACKGROUND OF THE INVENTION

1. Field of the Invention

The present invention relates to the magnetic resonance imaging (MRI) technology and, in particularly to an identification code circuit for a receiving coil in a magnetic resonance imaging system.

2. Description of the Prior Art

Magnetic resonance imaging is an imaging technology utilizing the magnetic resonance phenomenon. The basis of magnetic resonance phenomenon is that, for an atomic nucleus with an odd number of protons, such as the atomic nucleus of hydrogen which widely exists in the human body, the protons thereof have spin moments, just like a tiny magnet, and the spin axis of these tiny magnets normally has no regularity. If an external magnetic field is applied, however, the spin axis of these tiny magnets will be realigned by the magnetic field lines of the external magnetic field. In this state, by emitting radio frequency (RF) pulses with a specific frequency in order to excite the nuclei, these tiny magnets absorb a certain energy and resonance occurs, known as the magnetic resonance phenomenon. After stopping the radio frequency pulse emission, the excited atomic nuclei emit echo signals, and release the absorbed energy gradually as electromagnetic waves, and their phase and energy levels will return to the same state as before the excitation. The echo signals emitted by the atomic nuclei are further processed by spatial encoding, and an image can be reconstructed therefrom.

In a magnetic resonance imaging system, the pulses of the specific frequency are emitted to the atomic nuclei by a radio frequency transmitting coil, the echo signals emitted by the excited atomic nuclei are received by receiving coils. There is usually only one radio frequency transmitting coil, and depending on the site to be scanned there can be several receiving coils, which are also called local coils. A receiving coil can be inserted into a system socket by a system plug carried by itself, and the system plug connects the receiving coil to an identification code power supply of the system and ground respectively, then the receiving coil can be used normally, and the voltage of the abovementioned identification code power supply and the voltage of the internal resistance of the system power supply constitute together the total voltage of the system power supply. When scanning different parts of a human body, usually dedicated receiving coils are needed and they cannot be exchanged. This is because different receiving coils correspond to different specific parameters, such as scanning sequences, when the radio frequency transmitting coil works, how much power the radio frequency coil transmits and so on, so the use of a correct receiving coil can not only guarantee the quality of imaging, but also the safety of a patient, and it avoids the harm to the patient due to the excessive radio frequency absorption.

In order to ensure that the receiving coils are not to be mixed up, the best approach is to give each receiving coil a unique identification code, by which it can identify immediately among the receiving coils which is which. The simplest and most reliable way to realize such a unique identification code is to add a simple resistance circuit inside each receiving coil, so as to make different receiving coils correspond to different resistance values. Therefore, when a receiving coil corresponding to a different resistance value is connected into the system, the voltage of the receiving coil assigned by the identification code power supply of the system will change based on the different resistance value of the above resistance circuit, thereby realizing the identification of different receiving coils, and the above voltage assigned to each receiving coil is the identification code of that receiving coil.

For an ordinary receiving coil with an independent system plug, the realization of the above resistance circuit is very easy, but sometimes for the sake of cost saving, structure simplification, or for carrying out special scanning by a combination of several receiving coils, some of the receiving coils do not have independent system plugs, therefore such receiving coils cannot be connected to the system directly, and instead they must be connected to other receiving coils with independent system plugs, so as to realize the indirect connection into the system. The aforementioned receiving coils without independent system plugs are called sub-coils, and the receiving coils with independent system plugs are called main coils. Such a sub-coil usually comprises a coil plug, the main coil has a corresponding socket, the connection of the sub-coil to the main coil is realized by the insertion of the coil plug of the sub-coil into the corresponding socket of the main coil, and the combined two receiving coils will be identified by the system using one identification code.

The combination of the sub-coil and the main coil sometimes can be very complicated, such as a head receiving coil is the main coil. Another neck coil is the sub-coil, and these two receiving coils share one independent system plug connection system of the main coil; and assuming that the head receiving coil comprises the upper and lower two parts, and the neck receiving coil also includes the upper and lower two parts, so that the combination of these two receiving coils comprise multiple possibilities, such as the lower part of the head and the lower part of the neck, the whole head and the lower part of the neck, the lower part of the head and the whole neck, the whole head and the whole neck, etc. In order to distinguish the above different use conditions, an identification code will have to be set for each condition, and then the situations for the identification codes become very complicated.

In order to solve the above problem of complicated identification codes caused by the combinations of the sub-coil and the main coil, the following two solutions are known in the prior art.

In the first known solution, independently of the sub-coil or the main coil, each of the receiving coils is provided with an independent system plug, so the realization of the identification code is relatively simple, namely a resistance circuit is set up inside each receiving coil, so that different receiving coils correspond to different resistance values. Therefore, when the receiving coil corresponding to a different resistance value is connected to the system, the voltage of the receiving coil assigned by the system will be different, thus realizing the identification of the different receiving coils.

Although this solution is simple to implement, due to the high costs of the system plugs, the increase in the number of the system plugs is equivalent to the increase of the production costs of the receiving coils, and also the system needs correspondingly more sockets to meet the needs of the increased number of system plugs, thus leading to greatly increased system costs.

In the second solution, oscillating circuits are designed for the sub-coil and the main coil, and independent power supplies are created by using the oscillating circuits (such a power supply can be a negative power supply), after the main coil and sub-coil are connected into the system, the voltage generated by the independent power supply are added on top of the voltage of the identification code power supply, which will generate a different superposed voltage, and the system identifies the different combinations of the main coil and the sub-coil by the different superposed voltage values. In this case, the aforementioned different superposed voltage values are the identification codes corresponding to different combinations of the main coil and the sub-coil.

Although this method still allows the sub-coil to be connected to the system via the main coil and it saves costs, the design of the oscillating circuit itself is quite complicated. Currently, regarding the combination of the sub-coil and the main coil, there is not yet a solution that is not only cost-effective but also simple in realizing the generation of the identification codes.

SUMMARY OF THE INVENTION

An object of the present invention is to provide an identification code circuit for a receiving coil of a magnetic resonance imaging system, which aiming at the combination of a sub-coil and a main coil, can generate a receiving coil identification code in a simply way on the precondition of saving costs.

The above object is achieved according to the present invention by an identification code circuit for a receiving coil in a magnetic resonance imaging system, which circuit is embodied in a main coil, having a fixed resistance for generating an identification code of the main coil; the main coil having a socket for connecting a sub-coil, wherein a coil plug of the sub-coil is plugged into the socket so as to connect to the main coil, and wherein the identification code circuit also has a regulating resistance and a switch of the sub-coil corresponding to the socket. The coil plug of the sub-coil is plugged into the socket to close the switch of the sub-coil, so that the values of the regulating resistance and the fixed resistance are added together to form a combined resistance value. After the main coil has been connected to the magnetic resonance imaging system, the identification code source voltage value assigned to the combined resistance value is the identification code for the combined main coil and sub-coil.

In an embodiment, the number of sub-coils is one, and the identification code of the combined main coil and sub-coil is one bit. The fixed resistance for generating the identification code has a first fixed resistor and a second resistor. The second resistor is also used as a first adjusting resistor. The sub-coil switch is a first sub-coil switch, and the identification code circuit also has a first field effect transistor and a first additional resistor for a direct-current bias to the first field effect transistor. A first identification code power supply is connected to one end of the first fixed resistor, the second fixed resistor and the first additional resistor, respectively. The gate of the first field effect transistor is connected to the other end of the first additional resistor, and one end of the first sub-coil switch. The drain of the first field transistor is connected to the other end of the second fixed resistor, and the source of the first field effect transistor. The other end of the first sub-coil switch and the other end of the first fixed resistor are grounded.

In another embodiment, the number of sub-coils is one, and the identification code of the combined main coil and sub-coil is one bit. The fixed resistance for generating the identification code is a third fixed resistor. The adjusting resistance is a second adjusting resistor, and the sub-coil switch is a second sub-coil switch. A second identification code power supply is connected to one end of the third fixed resistor and the second adjusting resistor, respectively. The other end of the third fixed resistor is grounded. One end of the second sub-coil switch is connected to the other end of the second adjusting resistor, and the other end of the second sub-coil switch is grounded.

In another embodiment, the number of said sub-coils is one, and the identification code of the combined main coil and sub-coil is two bits. The fixed resistance for generating the identification code is a fourth fixed resistor, a fifth fixed resistor, and a sixth fixed resistor, wherein the sixth fixed resistor is also used as a third adjusting resistor. The adjusting resistance also includes a fourth adjusting resistor. The sub-coil switch is a third sub-coil switch. The identification code circuit also has a second field effect transistor, a third field effect transistor, and a fourth field effect transistor, and a second additional resistor for a direct-current bias to the second field effect transistor and the fourth field effect transistor, and a third additional resistor for a direct-current bias to the third field effect transistor. A third identification code power supply is connected to one end of the fourth fixed resistor, and the sixth fixed resistor respectively. A fourth identification code power supply is connected to one end of the fifth fixed resistor, the fourth adjusting resistor, the third additional resistor and the second additional resistor, respectively. The gate of the fourth field effect transistor is connected to the other end of the second additional resistor, one end of the third coil switch, and the gate of the second field effect transistor, respectively. The gate of the third field effect transistor is connected to the other end of the third additional resistor and the drain of the fourth field effect transistor, respectively. The other end of the sixth fixed resistor is connected to the drain of the second field effect transistor. The other end of the fourth adjusting resistor is connected to the drain of the third field effect transistor. The other end of the fourth fixed resistor, the other end of the fifth fixed resistor, the source of the second field effect transistor, the source of the third field effect transistor, the source of the fourth field effect transistor, and the other end of the third sub-coil switch are grounded.

In another embodiment, the number of sub-coils is one, and the identification code of the combined main coil and sub-coil is two bits. The fixed resistance for generating the identification code is a seventh fixed resistor and an eighth fixed resistor. The adjusting resistance is a fifth adjusting resistor and a sixth adjusting resistor. The sub-coil switch is a fourth sub-coil switch. The identification circuit also has a fifth field effect transistor, a sixth field effect transistor, and a seventh field effect transistor, and a fourth additional resistor for a direct-current bias to the fifth field effect transistor and the sixth field effect transistor, and a fifth additional resistor for a direct-current bias to the seventh field effect transistor. A fifth identification code power supply is connected to one end of the seventh fixed resistor and the fifth adjusting resistor, respectively. A sixth identification code power supply is connected to one end of the eighth fixed resistor, the sixth adjusting resistor, the fourth additional resistor and the fifth additional resistor, respectively. The gate of the seventh field effect transistor is connected to one end of the fourth sub-coil switch and the other end of the fifth additional resistor, respectively. The drain of the seventh field effect transistor is connected to the fourth additional resistor, the gate of the sixth field effect transistor, and the gate of the seventh field effect transistor, respectively. The drain of the sixth field effect transistor is connected to the other end of the sixth adjusting resistor, and the drain of the fifth field effect transistor is connected to the other end of the fifth adjusting resistor; the seventh fixed resistor, the eighth fixed resistor, the source of the fifth field effect transistor, the source of the sixth field effect transistor, and the other end of the fourth sub-coil switch are grounded.

In a further embodiment, the number of sub-coils is two, and the identification code of the combined main coil and sub-coil is four bits. The fixed resistance for generating the identification code is a ninth fixed resistor, a tenth fixed resistor, an eleventh fixed resistor, a twelfth fixed resistor, a thirteenth fixed resistor, and a fourteenth fixed resistor. The fourteenth fixed resistor is also used as a seventh adjusting resistor. The adjusting resistance also has an eighth adjusting resistor, a ninth adjusting resistor and a tenth adjusting resistor. The sub-coil switch comprises a fifth sub-coil switch, a sixth sub-coil switch and a seventh sub-coil switch. The identification code circuit also has an eighth field effect transistor, a ninth field effect transistor, a tenth field effect transistor, an eleventh field effect transistor, a twelfth field effect transistor, and a thirteenth field effect transistor, and a sixth additional resistor for a direct-current bias to the eighth effect field transistor, a seventh additional resistor for a direct-current bias to the ninth effect field transistor, an eighth additional resistor for a direct-current bias to the tenth field effect transistor, a ninth additional resistor for a direct-current bias to the eleventh field effect transistor and the twelfth field effect transistor, and a tenth additional resistor for a direct-current bias to the thirteenth field effect transistor. A seventh identification code power supply is connected to one end of the eighth additional resistor, one end of the fourteenth fixed resistor, one end of the eighth adjusting resistor, one end of the thirteenth fixed resistor, one end of the sixth additional resistor, respectively. An eighth identification code power supply is connected to one end of the twelfth fixed resistor, one end of the eleventh fixed resistor, and one end of the seventh additional resistor, respectively. A ninth identification code power supply is connected to one end of the ninth fixed resistor, one end of the ninth adjusting resistor, respectively. A tenth identification code power supply is connected to one end of the tenth fixed resistor, one end of the tenth adjusting resistor, one end of the ninth additional resistor and one end of the tenth additional resistor respectively. The gate of the eighth field effect transistor is connected to the other end of the sixth additional resistor, and one end of the fifth sub-coil switch, respectively, and its drain is connected to the other end of the thirteenth fixed resistor. The gate of the tenth field effect transistor is connected to the other end of the eighth additional resistor and one end of the sixth sub-coil switch, respectively, and its drain is connected to the other end of the fourteenth fixed resistor. The gate of the ninth field effect transistor is connected to the other end of the seventh additional resistor, one end of the seventh sub-coil switch, and the gate of the thirteenth field effect transistor, respectively, and its drain is connected to the other end of the eleventh fixed resistor. The gate of the eleventh fixed resistor is connected to the other end of the ninth additional resistor and the gate of the twelfth field effect transistor, respectively, and its drain is connected to the other end of the ninth adjusting resistor. The drain of the twelfth field effect transistor is connected to the other end of the tenth adjusting resistor. The gate of the thirteenth field effect transistor is connected to the other end of the tenth additional resistor, and its drain is connected to the other end of the ninth additional resistor. The other end of the eighth adjusting resistor, the other end of the twelfth fixed resistor, the source of the eighth field effect transistor, the source of the ninth field effect transistor, the source of the tenth field effect transistor, the other end of the fifth sub-coil switch and the other end of the sixth sub-coil switch are grounded. The other end of the ninth fixed resistor, the other end of the tenth fixed resistor, the source of the eleventh field effect transistor, the source of the twelfth field effect transistor, the source of the thirteenth field effect transistor, and the other end of the seventh sub-coil switch are grounded.

In another embodiment, the number of said sub-coils is two, and the identification code of the combined main coil and sub-coil is one bit. The fixed resistance for generating the identification code is a fifteenth fixed resistor. The adjusting resistance is an eleventh adjusting resistor and a twelfth adjusting resistor. The sub-coil switch is an eighth coil switch and a ninth coil switch. An eleventh identification code power supply is connected to one end of the fifth fixed resistor, one end of the eighth sub-coil switch, and one end of the ninth sub-coil switch, respectively. The other end of the eighth coil switch is connected to the eleventh adjusting resistor. The other end of the ninth coil switch is connected to one end of the twelfth adjusting resistor. The other end of the fifth fixed resistor, the other end of the eleventh adjusting resistor and the other end of the twelfth adjusting resistor are grounded.

In another embodiment, the number of sub-coils is three, and the identification code of the combined main coil and sub-coil is two bits. The fixed resistance for generating the identification code is a sixteenth fixed resistor and a seventeenth fixed resistor. The adjusting resistance is a thirteenth adjusting resistor, a fourteenth adjusting resistor, and a fifteenth adjusting resistor. The sub switch is a tenth sub-coil switch, an eleventh sub-coil switch, and a twelfth sub-coil switch. A twelfth identification code power supply is connected to one end of the sixteenth fixed resistor, one end of the tenth sub-coil switch, and one end of the eleventh sub-coil switch, respectively. A thirteenth identification code power supply is connected to one end of the seventeenth fixed resistor, and one end of the twelfth sub-coil switch, respectively. The other end of the tenth sub-coil switch is connected to one end of the thirteenth adjusting resistor, the other end of the eleventh sub-coil switch is connected to one end of the fifth adjusting resistor. The other ends of the sixteenth fixed resistor, the seventeenth fixed resistor, the thirteenth adjusting resistor, the fourteenth adjusting resistor and the fifteenth adjusting resistor are grounded.

The identification code circuit according to the present invention, by closing the sub-coil switch when the sub-coil is connected to the main coil, makes the values of the regulating resistance and the fixed resistance add together so as to form a combined resistance value. The voltage value across the combined resistance value is different from the voltage value when the main coil is not connected with the sub-coil. Therefore, after the main coil is connected with the sub-coil, the identification code is changed, so the system can identify the different receiving coil combinations according to the different identification codes. Since the identification code circuit according to the present invention does not need to increase the system plugs and sockets, it saves costs, and the change in the resistance value leads to the change in the identification code, so its realization is very simple.

DESCRIPTION OF THE PREFERRED EMBODIMENTS

Figure 1A:
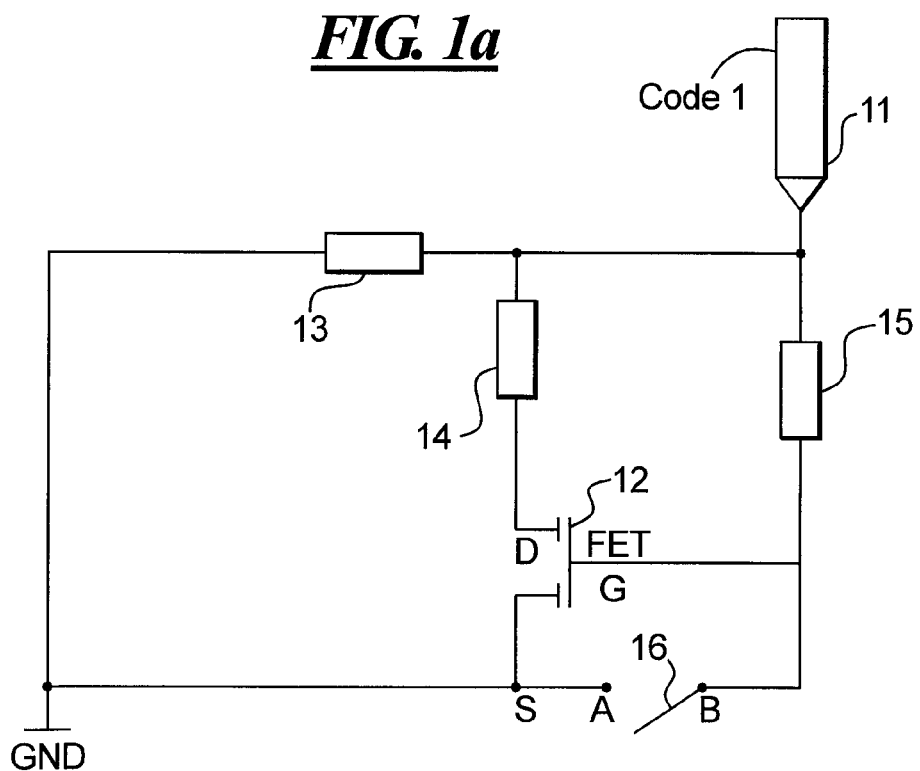
FIG. 1a is a schematic circuit diagram of a first particular example of a first embodiment according to an identification code circuit provided by the present invention.

In order to make the objects and advantages of the present invention more apparent, the present invention will be further described in detail below in conjunction with the accompanying drawings and embodiments, and these descriptions are non-limiting.

The identification code circuit according to the present invention is set in a main coil, having a fixed resistance for generating an identification code of the main coil, and the main coil has a socket for connecting with a sub-coil, on which a coil plug is for plugging into the socket so as to connect to the main coil. The identification code circuit according to the present invention also has a regulating resistance and a sub-coil switch corresponding to the socket, the coil plug of the sub-coil is to be plugged into said socket to close the sub-coil switch, then the values of the regulating resistance and the fixed resistance are added together to form a combined resistance value. After the main coil has been connected to a magnetic resonance imaging system, the voltage value assigned to the combined resistance value is the identification code of the combination of the main coil and the sub-coil.

It can be seen that in the identification code circuit according to the present invention, by closing the sub-coil switch when the sub-coil is connected to the main coil, makes the values of the regulating resistance and the fixed resistance add together, so as to form a combined resistance value. The voltage value across the combined resistance value is different from the voltage value when the main coil is not connected with the sub-coil. Therefore, after the main coil is connected with the sub-coil, the identification code is changed, so the system can identify the different receiving coil combinations according to the different identification codes. Since the identification code circuit provided by the present invention does not need to increase the system plugs and sockets, it saves costs, and the change in the resistance value leads to the change in the identification code, so its realization is very simple.

Two embodiments of the circuit provided by the present invention will be given in combination with particular examples.

In the first embodiment, an internal resistance circuit in the main coil is used as a basis, the resistance circuit comprises a sub-coil switch which is closed after the sub-coil is plugged in and a transistor that controls the jump of the resistance value; the transistor can be a field effect transistor or a triode. When the sub-coil is plugged into a corresponding socket of the main coil via its coil plug, the sub-coil switch in the internal resistance circuit of the main coil is closed. The closing of the switch leads to a short circuit in a part of the resistance circuit, which controls the change of the transistor's state, further leading to the jump of the total resistance value of the resistance circuit, thus realizing the change in the combined receiving coil voltage value assigned by the system after the sub-coil is connected to the main coil, for example the assigned voltage becomes bigger or smaller, namely, a desired change is realized in which the identification codes jump from big to small, or from small to big after the sub-coil is plugged into the main coil.

In order to introduce the particular principles of the first embodiment briefly and clearly, an example is described in which the number of the identification code is one (code1), and the main coil is only connected to one sub-coil. FIG. 1a is a diagram of a first example of the first embodiment according to the circuit of the present invention.

As shown in FIG. 1a, the circuit has a first identification code power supply 11, a first field effect transistor 12, a first fixed resistor 13, a second fixed resistor 14, a first additional resistor 15 and a first sub-coil switch 16. The voltage of the first identification code power supply 11 is the system power supply voltage except for the voltage assigned to the system power supply's internal resistance. The first field effect transistor 12 has a gate (G electrode), a drain (D electrode) and a source (S electrode). When the voltage on the G electrode is higher than that on the S electrode, and the voltage on the D electrode is higher than that on the S electrode, the D electrode and the S electrode are connected. The first fixed resistor 13 and the second fixed resistor 14 are the fixed resistors. The second fixed resistor 14 is also used as a first regulating resistor. The resistance value of the first additional resistor 15 is much higher than that of the first fixed resistor 13 and the second fixed resistor 14, and compared to the identification code resistor, it can be considered that the branch circuit having the first additional resistor 15 is an open circuit, and its main role is to provide a direct-current bias to the field effect transistor 12. The sub-coil's coil plug has two contacts, corresponding to two end points A and B of the first sub-coil switch 16, and when it is plugged into the corresponding socket of the main coil, the switch 16 is closed and short-circuited. The designation FET shown in FIG. 1a represents the field effect transistor, and the designation GND represents ground.

According to the circuit shown in FIG. 1a, when no sub-coil is plugged in, the first sub-coil switch 16 is in the off state, the voltage on the G electrode of the first field effect transistor 12 is higher than that on the S electrode, the voltage on the D electrode is also higher than that on the S electrode. Therefore the D electrode and the S electrode of the first field effect transistor 12 are connected. At this moment the resistance value of the main coil is the parallel value of the first fixed resistor 13 and the second fixed resistor 14. When the sub-coil is inserted into the main coil by its coil plug, the first coil switch 16 is closed and short-circuited, and the voltage on the G electrode and the voltage on the S electrode of the first field effect transistor 12 are the same. Therefore, the D electrode and the S electrode of the first field effect transistor 12 are not connected. At this moment the combined resistance value after the sub-coil is connected to the main coil is the value of the first fixed resistor 13, which value is increased in comparison to that before the sub-coil was connected, i.e. the parallel value of the first fixed resistor 13 and the second fixed resistor 14. Therefore the assigned voltage is increased after the sub-coil is connected to the main coil and realizes the jump of the identification code from small to big.

Figure 1B:
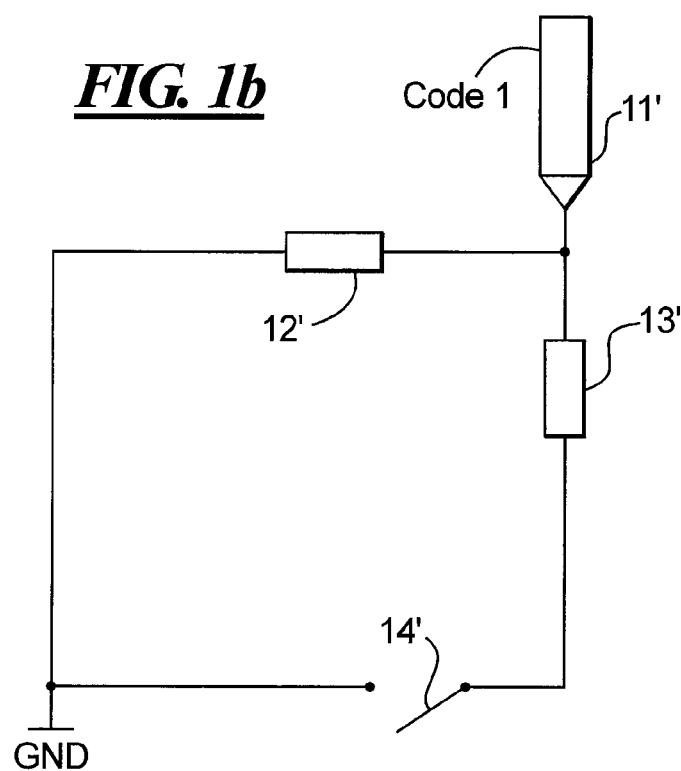
FIG. 1b is a schematic circuit diagram of a second particular example of the first embodiment according to an identification code circuit provided by the present invention.

FIG. 1b is a structural diagram of a second particular example of the first embodiment according to the identification code circuit according to the present invention. In this particular example, the number of the identification code is one (code1), the number of the sub-coil is also one. As shown in FIG. 1b, the circuit comprises a first identification code power supply 11', a third fixed resistor 12', a second regulating resistor 13', and a second sub-coil switch 14'. In which case, the second sub-coil switch 14' has the same role as the first sub-coil switch 16 shown in FIG. 1a, that is when the sub-coil is inserted into the corresponding socket of the main coil by its coil plug, the second sub-coil switch 14' is closed and short-circuited, and the first identification code power supply 11' also has the same role as the first identification code power supply 11 shown in FIG. 1a.

According to the circuit shown in FIG. 1b, when no sub-coil is connected, the first sub-coil switch 14' is in the off state, and the resistance value of the main coil is the resistance value of the third fixed resistor 12'. When the sub-coil is inserted into the main coil by its coil plug, the second coil switch 14' is closed and short-circuited, the resistance value after the sub-coil is inserted into the main coil is the parallel value of the third fixed resistor 12' and the second regulating resistor 13', so the value is reduced relative to the third fixed resistor 12' before the sub-coil is connected. Therefore, the voltage is decreased after the sub-coil is connected to the main coil and it realizes a jump of the identification code from big to small.

The above FIG. 1a and FIG. 1b are respectively based on the internal resistance circuits of the main coil with different structures to realize the different jumps of the identification code after the sub-coil is connected. In practical applications, except for using only one identification code, there are still other relatively complicated cases, for example, when the identification code is of two bits.

Figure 2A:
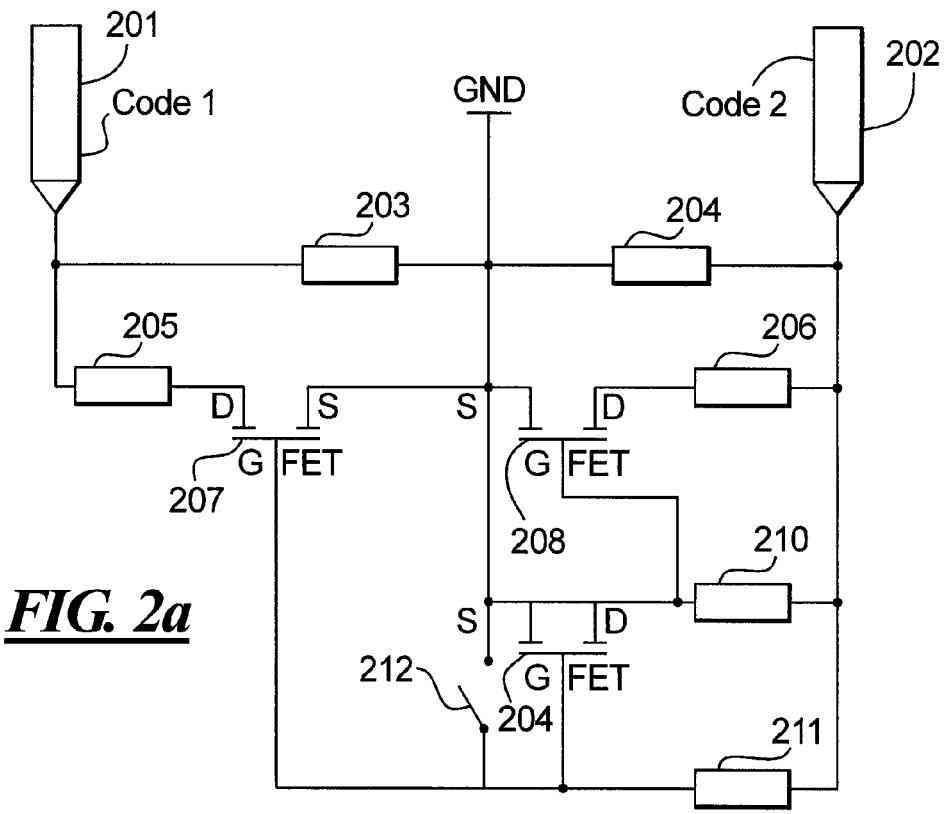
FIG. 2a is a schematic structural diagram of a third particular example of the first embodiment according to the identification code circuit provided by the present invention.

In the second embodiment, it takes an example that the identification code is of two bits, the main coil is only connected to one sub-coil, and the two identification codes are represented by code1 and code2, respectively. FIG. 2a is a diagram of a third particular example of the first embodiment according to the identification code circuit provided by the present invention.

As shown in FIG. 2a, the circuit has a third identification code power supply 201, a fourth identification code power supply 202, a fourth fixed resistor 203, a fifth fixed resistor 204 and a sixth fixed resistor 205. The sixth fixed resistor 205 is also used as the third regulating resistor. The circuit also has a fourth regulating resistor 206, a second field effect transistor 207, a third field effect transistor 208, a fourth field effect transistor 209, a third additional resistor 210, a second additional resistor 211 and a third sub-coil switch 212. The role of the third sub-coil switch 212 and the two identification code power supplies are the same as in the example described above and need not be described again. The resistance values of the third additional resistor 210 and the second additional resistor 211 are higher than that of the other resistors. Their role is to provide a direct-current bias to the field effect transistor, and each of the respective branch circuits they are in can be regarded as an open circuit. The left part shown in FIG. 2a influences the first bit code1 of the identification code, and the right part influences the second bit code2 of the identification code.

According to the circuit shown in FIG. 2a, when no sub-coil is plugged, the third sub-coil switch 212 is in the off state, the voltage on the G electrode of the second field effect transistor 207 is higher than that on the S electrode, and the voltage on the D electrode is higher than that on the S electrode. Therefore, the D electrode and the S electrode of the second field effect transistor 207 are connected, the resistance value of the left part is the parallel value of the fourth fixed resistor 203 and the sixth fixed resistor 205. The voltage on the G electrode of the fourth field effect transistor 209 is higher than that on the S electrode, and the voltage on the D electrode is higher than that on the S electrode. Therefore, the D electrode and the S electrode of the fourth field effect transistor 209 are connected, and since the G electrode of the third field effect transistor 208 is connected to the D electrode of the fourth field effect transistor 209, the voltage of the G electrode of the third field effect transistor 208 is equal to ground and it is the same as the voltage on the S electrode. The D electrode and the S electrode of the third field effect transistor 208 are not connected, and the resistance value of the right part is the resistance value of the fifth fixed resistor 204.

According to the circuit shown in FIG. 2a, when the sub-coil is inserted into the main coil by its coil plug, the third coil switch 212 is closed and short-circuited, the ground voltage of the G electrode of the second field effect transistor 207 equals the voltage on the S electrode. Therefore, the D electrode and the S electrode of the second field effect transistor 207 are not connected, and this leads to the case that the resistance value of the left part becomes the value of the fourth fixed resistor 203, and the value is increased compared to when the sub-coil is not connected. The G electrode of the fourth field effect transistor 209 is equivalent to ground and equals the voltage on the S electrode. Therefore, the D electrode and the S electrode of the fourth field effect transistor 209 are not connected. At this moment the voltage on the G electrode of the third field effect transistor 208 is increased to higher than that of the S electrode, and the voltage of the D electrode is also higher than that of the S electrode. Therefore the D electrode and the S electrode of the third field effect transistor 208 are connected, the resistance value of the right part is the parallel value of the fifth fixed resistor 204 and the fourth regulating resistor 206, which value is reduced compared to when the sub-coil is not connected.

Figure 2B:
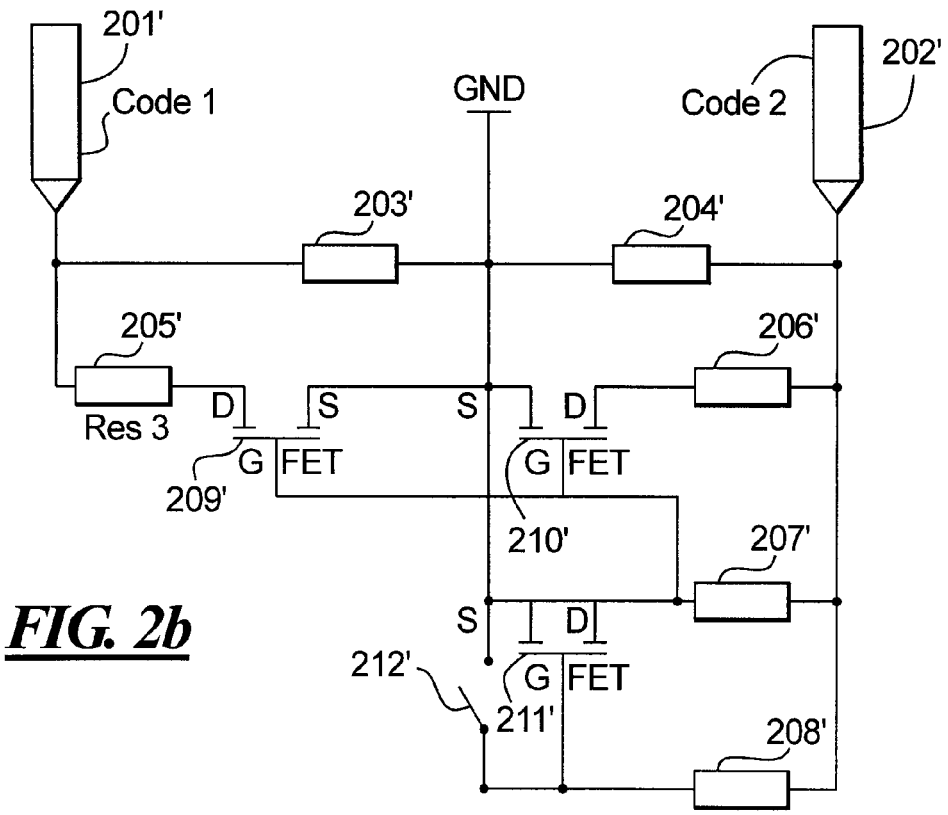
FIG. 2b is a schematic circuit diagram of a fourth particular example of the first embodiment according to the identification code circuit provided by the present invention.

FIG. 2b is a diagram of a fourth particular example of the first embodiment according to the identification code circuit according to the present invention. As shown in FIG. 2b, the circuit has a fifth identification code power supply 201', a sixth identification code power supply 202', a seventh fixed resistor 203', an eighth fixed resistor 204', a fifth regulating resistor 205', a sixth regulating resistor 206', a fourth additional resistor 207', a fifth additional resistor 208', a fifth field effect transistor 209', a sixth field effect transistor 210', a seventh field effect transistor 211', and a fourth sub-coil switch 212'. The roles of the fourth sub-coil switch 212' and the two identification code power supplies are the same as in the particular examples described above, and need not be described again. The resistance values of the fourth additional resistor 207' and the fifth additional resistor 208' are higher than that of the other resistors, and their roles are to provide direct-current bias to the field effect transistors, and the branch circuits they are in can be regarded as open circuits. The left part shown in FIG. 2b influences the first bit code1 of the identification code, and the right part exerts influence on the second bit code2 of the identification code.

According to the circuit shown in FIG. 2b, when no sub-coil is plugged in, the fourth sub-coil switch 212' is in the off state, the voltage on the G electrode of the seventh field effect transistor 211' is higher than that on the S electrode, and the voltage on the D electrode is higher than that on the S electrode. Therefore, the D electrode and the S electrode of the seventh field effect transistor 211' are connected, and since the G electrode of the fifth field effect transistor 209' is connected to the D electrode of the field effect transistor 211', the G electrode of the fifth field effect transistor 209' is equivalent to ground and its voltage equals the voltage on the S electrode. Therefore, the D electrode and the S electrode of the fifth field effect transistor 209' are not connected, and the resistance value of the left part is the resistance value of the seventh fixed resistor 203'. Analogous to the operation of the left part, since the G electrode of the sixth field effect transistor 210' is connected to the D electrode of the field effect transistor 211', the G electrode of the sixth field effect transistor 210' is equivalent to ground and its voltage equals the voltage on the S electrode. Therefore, the D electrode and the S electrode of the sixth field effect transistor 210' are not connected, and the resistance value of the right part is the resistance value of the eighth fixed resistor 204'.

According to the circuit shown in FIG. 2b, when the sub-coil is inserted into the main coil by its coil plug, the fourth coil switch 212' is closed and short-circuited, the G electrode of the seventh field effect transistor 211' is ground and its voltage equals the voltage on the S electrode. Therefore, the D electrode and the S electrode of the seventh field effect transistor 211' are not connected. This causes the voltage on the G electrode of the fifth field effect transistor 209' to be increased to higher than that on the S electrode, and the voltage of the D electrode is higher than that on the S electrode. Therefore, the D electrode and the S electrode of the fifth field effect transistor 209' are connected, the resistance value of the left part is the parallel value of the seventh fixed resistor 203' and the fifth regulating resistor 205', which value is reduced compared to when the sub-coil is not connected. Analogous to the operation of the left part, since the G electrode of the sixth field effect transistor 210' is connected to the D electrode of the seventh field effect transistor 211', the voltage on the G electrode of the sixth field effect transistor 210' is increased to higher than that on the S electrode, and the voltage of the D electrode is higher than that of the S electrode. Therefore, the D electrode and the S electrode of the sixth field effect transistor 210' are connected, the resistance value of the left part is the parallel value of the eighth fixed resistor 204' and the sixth regulating resistor 206', which value is reduced compared to when the sub-coil is not connected.

The above four particular examples are only simple examples for illustrating the principles of the first particular embodiment of the identification code circuit provided by the present invention, and according to the principles described in these examples, more complicated identification codes for the combined main coil and sub-coil(s) can be generated.

Figure 3:
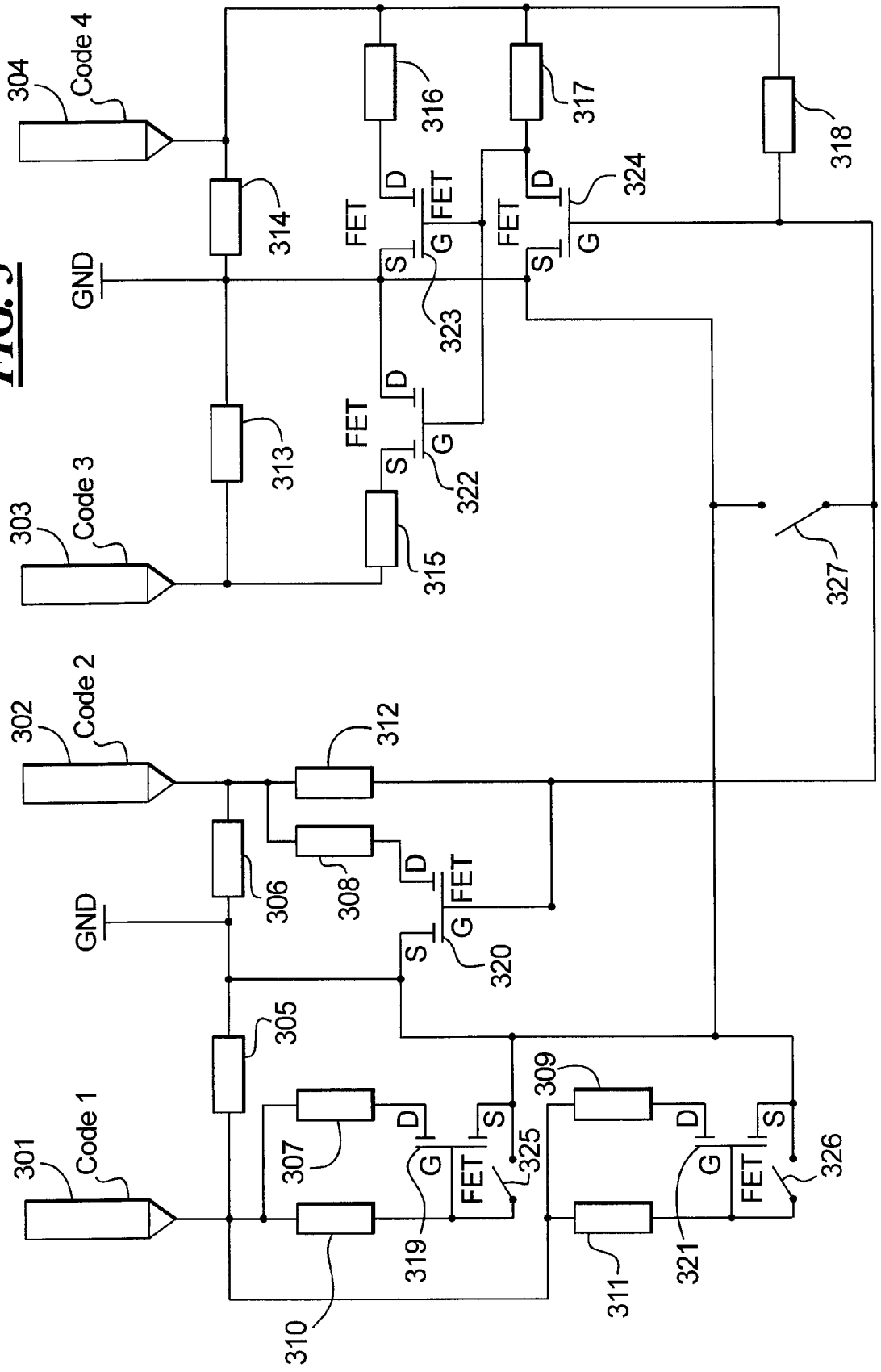
FIG. 3 is a schematic structural diagram of an embodiment according to an identification code circuit provided by the present invention.

Also in accordance with the first particular embodiment, eight different identification codes can be generated after having one main coil and two sub-coils combined. Assuming that the main coil is a head coil, which has an upper part and a lower part, wherein the lower part has a system plug, two sockets for inserting the sub-coil and a socket for inserting therein the upper part of the head coil are provided. Therefore, the lower part of the head coil is always in a working state, so the lower part is the main coil in a real sense, and the upper part can be the sub-coil for connecting to the lower part. The abovementioned lower part has a resistance circuit corresponding to the above two sockets for inserting therein the sub-coil and a socket for inserting the upper part of the head coil, and it has a switch which will be closed after the sub-coil is plugged in and a switch which will be closed after the upper part of a head coil is plugged in. The internal resistance circuit of the lower part of the main coil is shown in FIG. 3; the identification code of the resistance circuit is formed by four bits code1 to code4. In the circuit shown in FIG. 3, when no sub-coil is inserted therein, the resistor which is effective for the generation of the identification codes is the fixed resistor, the resistor for regulating the resistance value when the sub-coil is inserted is the regulating resistor, and the resistor for a direct-current bias to the field effect transistor is the additional resistor.

As shown in FIG. 3, the circuit has a seventh identification code power supply 301, an eighth identification code power supply 302, a ninth identification code power supply 303, a tenth identification code power supply 304, a ninth fixed resistor 313, a tenth fixed resistor 314, an eleventh fixed resistor 308, a twelfth fixed resistor 306, a thirteenth fixed resistor 307 and a fourteenth fixed resistor 309. The fourteenth fixed resistor 309 also acts as a seventh regulating resistor. The regulating resistance also is formed by an eighth regulating resistor 305, a ninth regulating resistor 315 and a tenth regulating resistor 316. The circuit further has an eighth field effect transistor 319, a ninth field effect transistor 320, a tenth field effect transistor 321, an eleventh field effect transistor 322, a twelfth field effect transistor 323, a thirteenth field effect transistor 324 and a fifth sub-coil switch 325, a sixth sub-coil switch 326, and a seventh sub-coil switch 327. The seventh sub-coil switch 327 is used as the switch for inserting the upper part plug of the head coil, the corresponding sub-coil of the fifth sub-coil switch 325 is the upper part of the neck coil, the corresponding sub-coil of the sixth sub-coil switch 326 is the lower part of the neck coil.

According to the circuit shown in FIG. 3, an analysis is made on the basis of the states of the switch 327 corresponding to the main coil.

The first case is that the seventh sub-coil switch 327 corresponding to the main coil is in the off state, namely, at this moment the lower part of the head coil is selected. In this case, according to the principles of the simple example described above, when the D electrode and the S electrode of the thirteenth field effect transistor 324 are connected, this leads to the disconnection of the D electrodes and the S electrodes of the eleventh field effect transistor 322 and the twelfth field effect transistor 323, the corresponding resistance value of code3 is that of the ninth fixed resistor 313, and the corresponding resistance value of code4 is that of the tenth fixed resistor 314. Based on the above analysis of the corresponding resistance values of code3 and code4, the resistance value of code1 influenced by the connection of the sub-coil is divided into the following cases:

(1) if neither the first sub-coil and the second sub-coil is connected, namely, at this moment the lower part of the head coil is used alone, then the fifth sub-coil switch 325 and the sixth sub-coil switch 326 are both in the off state, then the D electrode and the S electrode of the tenth field effect transistor 321 are connected, the D electrode and the S electrode of the eighth field effect transistor 319 are connected, the corresponding resistance value of code1 is the value that is obtained by the thirteenth fixed resistor 307 in parallel with the fourteenth fixed resistor 309 and then they are in series with the eighth regulating resistor 305, the corresponding resistance value code2 is the parallel value of the eleventh fixed resistor 308 and the twelfth fixed resistor 306;

(2) if the first sub-coil is connected and the second sub-coil is not connected, namely, at this moment on the basis of using the lower part of the head coil, the use of the upper part of the neck coil is further combined, then the fifth sub-coil switch 325 is closed and short-circuited, and the sixth sub-coil switch 326 is still in the off state, and at this moment the D electrode and the S electrode of the eighth field effect transistor 319 are not connected due to the fact that the fifth sub-coil switch 325 is closed and short-circuited, and the D electrode and the S electrode of the tenth field effect transistor 321 are still connected, the corresponding resistance value of code1 is the series value of the eighth regulating resistor 305 and the fourteenth fixed resistor 309, the corresponding resistance value of code2 is not influenced by the closed and short-circuited fifth sub-coil switch 325;

(3) if the first sub-coil is connected and the second sub-coil is also connected, namely, at this moment on the basis of using the lower part of the head coil, the use of the upper part and the lower part of the neck coil is further combined, then the fifth sub-coil switch 325 and the sixth sub-coil 326 are closed and short-circuited, and at this moment the D electrode and the S electrode of the eighth field effect transistor 319 and the tenth filed effect transistor 321 are not connected, therefore the corresponding resistor value of code1 is the eighth regulating 305, and the corresponding resistance value of code2 is not influenced by the closed and short-circuited fifth sub-coil switch 325 and sixth sub-coil switch 326;

(4) if the first sub-coil is connected and the second sub-coil is connected, namely, at this moment on the basis of using the lower part of the head coil, the use of the lower part of the neck coil is further combined, the fifth sub-coil switch 325 is in the off state, and the sixth sub-coil switch 326 is closed and connected, and at this moment the D electrode and the S electrode of the tenth field effect transistor 321 are not connected, the D electrode and the S electrode of the eighth field effect transistor 319 are connected, so the corresponding resistor value of code1 is the parallel value of the eighth regulating resistor 305 and the thirteenth fixed resistor 307, and the corresponding resistance value of code2 is not influenced by the closed and connected sixth sub-coil switch 326.

The second case is that the seventh sub-coil switch 327 corresponding to the main coil is in the on state, namely, the whole head coil is used. In this case, according to the principles of the simple example described above, when the D electrode and the S electrode of the thirteenth field effect transistor 324 are not connected, this leads to the case that the D electrodes and the S electrodes of the eleventh field effect transistor 322 and the twelfth field effect transistor 323 are connected, so the corresponding resistance value of code3 is the parallel value of the ninth fixed resistor 313 and the ninth regulating resistor 315, the corresponding resistance value of code4 is the parallel value of the tenth fixed resistor 314 and the tenth regulating resistor 316; the D electrode and the S electrode of the ninth field effect transistor 320 are not connected, the corresponding resistance value of code2 is that of the twelfth fixed resistor 306; and the corresponding resistance value of code1 is the same as in the above analysis (1) to (4) of the first case.

According to the two operating conditions of the above head coil, in combination with the operating conditions of a particular neck coil, it can calculate in advance the voltage values to be assigned to the resistance values corresponding to that of code1 to code4 in different combinations, which are used as the identification codes for the above different combinations. The relationship between all the calculated voltage values and the corresponding combinations is saved, and when the receiving coil in a different combination is connected to the system, the system can judge correctly according to the corresponding relationship which one or which combinations of receiving coils is/are currently connected.

It can be seen that for the circuit shown in FIG. 3, the number of the main coil and the sub-coils is three, and eight different identification codes are produced by their combination, of course only one particular example is shown in FIG. 3, when the structure of the resistance circuit of the main coil is different from that shown in FIG. 3, the changes in identification codes may be different from the above analysis, but the principles for the analysis are the same.

Described above is the first general embodiment of the circuit according to the present invention. The second general embodiment of the circuit according to the present invention will be described below.

In the second general embodiment, the main coil embodies a resistance circuit. The main coil has a socket for inserting therein a sub-coil, which is the same as that described in the first embodiment. Corresponding to the socket for inserting the sub-coil, the internal resistance circuit of the main coil has a corresponding sub-coil switch, and when the sub-coil is plugged into the main coil via the socket, the above sub-coil switch is closed. When the main coil is used alone, the identification code is determined by the fixed resistance value of the main coil, and when the sub-coil is plugged into the main coil, a parallel relationship is formed between the regulating resistor and the fixed resistor of the main coil in the resistance circuit; when the main coil, or the combination of the main coil and the sub-coil is connected into the system, to the different resistance values, different voltages are assigned by the system; these different voltage values are the identification codes for identifying the receiving coil in the system. It can be seen from the second embodiment that the more sub-coils are plugged into the main coil, and the more resistance values are connected in parallel, then the smaller the assigned resistance value after having connected to system, and the smaller the identification code.

Figure 4:
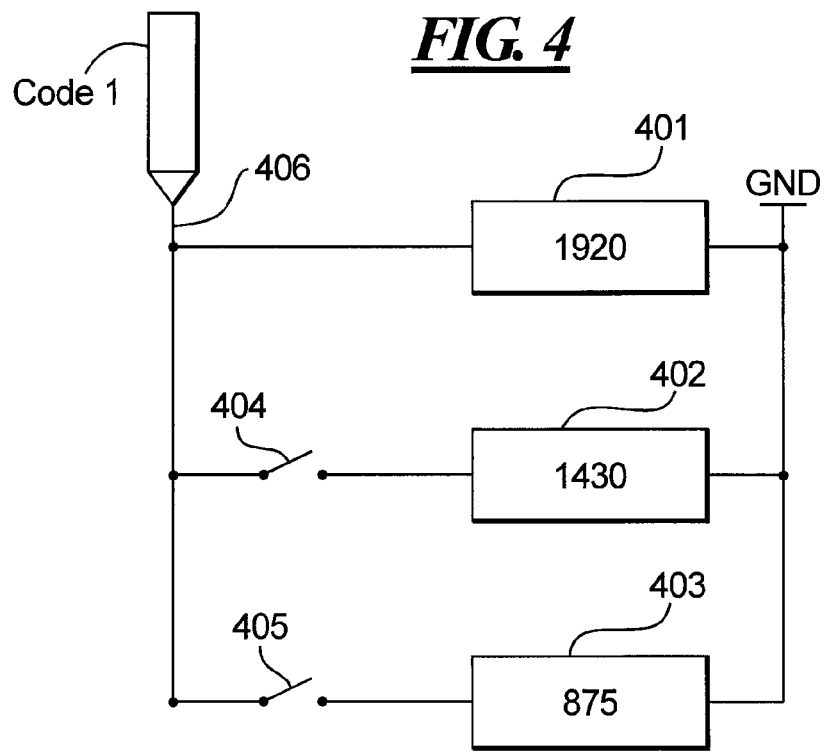
FIG. 4 is a schematic circuit diagram of a first particular example of the second embodiment according to the identification code circuit provided by the present invention.

FIG. 4 is a diagram of a first particular example of the second embodiment according to an identification code circuit provided by the present invention, and as shown in the figure, the number of the identification code is one; the number of the sub-coils is two. Since the object of FIG. 4 is merely to show the fundamental principles of the embodiment, each part in the figure does not represent actual components in an actual circuit, it just represents the schematic framework of each part in the circuit. A fifteenth fixed resistor 401 represents the corresponding fixed resistor of the main coil, of which the value is 1920Ω; an eleventh regulating resistor 402 represents the corresponding regulating resistor of the first sub-coil which is connected to the main coil, of which the value is 1430Ω; a twelfth regulating resistor 403 represents the corresponding regulating resistor of the second sub-coil which is connected to the main coil, of which the value is 875Ω; an eighth sub-coil switch 404 represents the closed sub-coil switch when the first sub-coil switch is plugged in, and a ninth sub-coil switch 405 represents the closed sub-coil switch when the second sub-coil switch is plugged in, 406 represents the eleventh identification code power supply.

It can be seen form FIG. 4 that when the first sub-coil is connected, the eighth sub-coil switch 404 is closed, so the resistance value after the first sub-coil is connected to the main coil is the parallel value of the fifth fixed resistor 401 and the eleventh regulating resistor 402, and this parallel value is lower than 1430Ω. When the second sub-coil is connected, the ninth sub-coil switch 405 is closed, so the resistance value after the second sub-coil is connected to the main coil is the parallel value of the fifth fixed resistor 401 and the eleventh regulating resistor 402 and the twelfth regulating resistor 403, and this parallel value is lower than 875Ω. Therefore, the generation of the identification code combined by the sub-coil and the main coil can be realized.

Figure 5:
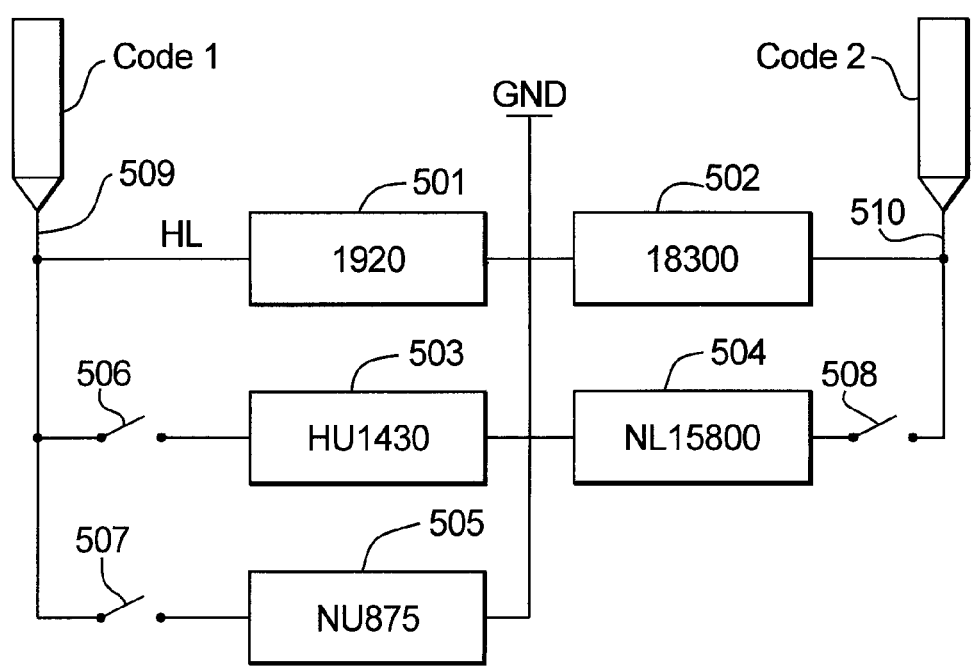
FIG. 5 is a schematic circuit diagram of a second particular example of the second embodiment according to the identification code circuit provided by the present invention.

FIG. 5 is a diagram of a second particular example of the second embodiment according to an identification code circuit according to the present invention. In this particular example, the identification code is two bits, and the number of the sub-coils is three, and FIG. 5 is also merely to show the implementing principles of the example. In this example, the main coil is a head coil, which comprises an upper part and a lower part, marked by HL and HU respectively. The sub coils comprise two, which are respectively the upper part and the lower part of the neck coil, designated NL and NU, respectively. A system plug in the main coil is in the lower part, the sockets for inserting the sub-coils and the socket for inserting the upper part of the main coil are also in the lower part. Therefore, the basic working condition of the main coil is to use the lower part, and its upper part is equivalent to the sub-coil which is to be connected to the lower part, therefore the number of the sub-coils is three. The resistance circuit shown in FIG. 5 is also in the lower part; the particular combination states in the embodiment are HL, HL+HU, HL+NL, HL+HU+NL, HL+NL+NU, and HL+HU+NL+NU.

As shown in FIG. 5, the resistance circuit is in the lower part of the head coil, wherein the sixteenth fixed resistor 501 and the seventeenth fixed resistor 502 represent the fixed resistor corresponding to the lower part of the head coil, of which the values are 1920Ω and 18300Ω, respectively. The thirteenth regulating resistor 503 represents the regulating resistor corresponding to the upper part of the head coil, of which the value is 1430ω; the fourteenth regulating resistor 504 represents the regulating resistor corresponding to the lower part of the neck coil, of which the value is 15800Ω); the fifteenth regulating resistor 505 represents the regulating resistor corresponding to the upper part of the neck coil, of which the value is 875Ω. The tenth sub-coil switch 506 represents the closed sub-coil switch corresponding to the upper part of the head coil being connected; the eleventh sub-coil switch 507 represents the closed sub-coil switch corresponding to the upper part of the neck coil being connected; the twelfth sub-coil switch 508 represents the closed sub-coil switch corresponding to the lower part of the neck coil being connected. The twelfth identification code power supply 509 and the thirteenth identification code power supply 510 represent two identification code power supplies.

According to the principles analyzed above, when neither of the tenth sub-coil switch 506, the eleventh sub-coil switch 507 or the twelfth sub-coil switch 508 is connected, the combination state HL is realized; when the tenth sub-coil switch 506 is closed, and the eleventh sub-coil switch 507 and the twelfth sub-coil switch 508 are not connected, the combination state HL+HU is realized; when the twelfth sub-coil switch 508 is closed, the tenth sub-coil switch 506 and the eleventh sub-coil switch 507 are not connected, the combination state HL+NL is realized; when the tenth sub-coil switch 506 and the twelfth sub-coil switch 508 are closed, the eleventh sub-coil switch 507 is not connected, the combination state HL+HU+NL is realized; when the tenth sub-coil switch 506, the eleventh sub-coil switch 507 and the twelfth sub-coil switch 508 are all closed, the combination state HL+HU+NL+NU is realized. The more sub-coils connected in parallel with the lower part of the head coil, the smaller the combined resistance value, and then the smaller the corresponding identification code. What is shown in FIG. 5 is only a particular example, the specific structures of the resistance circuits in the practical applications may be different, but the principles they follow are the same as that in FIG. 5

Although modifications and changes may be suggested by those skilled in the art, it is the intention of the inventors to embody within the patent warranted hereon all changes and modifications as reasonably and properly come within the scope of their contribution to the art.

We claim as our invention:

1. An identification code circuit for a receiving coil in a magnetic resonance imaging system, said identification code circuit comprising:
   a main receiving coil having a coil housing comprising a socket configured to connect to a sub-coil to said main receiving coil by plugging a sub-coil plug of the sub-coil into said socket, said sub-coil comprising a switch that is closed by plugging said sub-coil plug of said sub-coil into said socket;
   a circuit embodied in said coil housing comprising a fixed resistance that generates an identification code for the main coil, and a regulating resistance, with closure of said switch of said sub-coil causing respective values of said regulating resistance and said fixed resistance to be added together to form a combined resistance value; and
   upon connection of said main coil to said magnetic resonance system, an identification code source voltage value across said combined resistance value representing an identification code for the combined main coil and sub-coil.

2. An identification code circuit as claimed in claim 1 comprising a single sub-coil and wherein said identification code for the combined main coil and sub-coil is one bit, and wherein said fixed resistance comprises a first fixed resistor and a second fixed resistor, said second fixed resistor also serving as an adjusting resistor that forms said adjusting resistance, and wherein said circuit in said main coil housing further comprises:
   a field effect transistor;
   an additional resistor that direct-current biases said field effect transistor;
   an identification code power supply connected to one end of the first fixed resistor, one end of the second fixed resistor, and one end of the additional resistor, respectively; and
   said field effect transistor having a gate connected to the other end of said additional resistor and one end of said sub-coil switch, respectively, a drain connected to the other end of the second fixed resistor, and a source connected to ground, with the other end of said sub-coil switch and the other end of said first fixed resistor also being connected to ground.

3. An identification code circuit as claimed in claim 1 comprising a single sub-coil, and wherein the identification code of the combined main coil and sub-coil is one bit, and wherein said fixed resistance comprises a fixed resistor and said adjusting resistance comprises an adjusting resistor, and wherein said identification code circuit comprises an identification code power supply connected to one end of said fixed resistor and one end of said adjusting resistor, respectively, with the other end of said fixed resistor being connected to ground, one end of said sub-coil switch being connected to the other end of the adjusting resistor, and the other end of the sub-coil switch being connected to ground.

4. An identification code circuit as claimed in claim 1 comprising a single-sub-coil, and wherein the identification code of the combined main coil and sub-coil is two bits, said fixed resistance comprising a first fixed resistor, a second fixed resistor and a third fixed resistor, and wherein said adjusting resistance comprises an adjusting resistor and said third fixed resistor, and wherein said identification code circuit further comprises:
   a first field effect transistor, a second field effect transistor, and a third field effect transistor, each of said first, second and third field effect transistors having a source electrode, a drain electrode and a gate electrode;
   a first additional resistor that direct-current biases each of said first and third field effect transistors, and a second additional resistor that direct-current biases said second field effect transistor;
   a first identification code power supply connected to one end of the first fixed resistor and one end of the third fixed resistor, respectively;

a second identification code power supply connected to one end of the second fixed resistor, one end of the adjusting resistor, one end of the first additional resistor, and one end of the second additional resistor, respectively;

the gate of the third field effect transistor being connected to the other end of the first additional resistor, one end of the sub-coil switch, and to the gate of the first field effect transistor, respectively;

the gate of the second field effect transistor being connected to the other end of the second additional resistor and to the drain of the third field effect transistor, respectively;

the other end of the third fixed resistor being connected to the drain of the first field effect transistor;

the other end of the adjusting resistor being connected to the drain of the third field effect transistor; and the other end of the first fixed resistor, the other end of the fifth fixed resistor, the source of the first field effect transistor, the source of the second field effect transistor, the source of the third field effect transistor, and the other end of the sub-coil switch all being connected to ground.

5. An identification code circuit as claimed in claim 1 comprising a single sub-coil, and wherein the identification code of the combined main coil and sub-coil is two bits, and wherein said fixed resistance comprises a first fixed resistor and a second fixed resistor, and wherein said adjusting resistance comprises a first adjusting resistor and a second adjusting resistor, and wherein said identification code circuit further comprises:

a first field effect transistor, a second field effect transistor, and a third field effect transistor, each of said first, second and third field effect transistors having a source electrode, a drain electrode and a gate electrode;

a first additional resistor that direct-current biases said first and second field effect transistors;

a second additional resistor that direct-current biases said second field effect transistor;

a first identification code power supply connected to one end of the first fixed resistor and one end of the first adjusting resistor, respectively;

a second identification code power supply connected to one end of the second fixed resistor, one end of the second adjusting resistor, one end of the first additional resistor, and one end of the second additional resistor, respectively;

the gate of the third field effect transistor being connected to one end of the sub-coil switch, and the other end of the second additional resistor, respectively;

the drain of the third field effect transistor being connected to the second additional resistor, the gate of the first field effect transistor, and the gate of the second field effect transistor, respectively;

the drain of the second field effect transistor being connected to the other end of the second adjusting resistor;

the drain of the first field effect transistor being connected to the other end of the first adjusting resistor; and the first fixed resistor, the second fixed resistor, the source of the first field effect transistor, the source of the second field effect transistor, and the other end of the sub-coil switch all being connected to ground.

6. An identification code circuit as claimed in claim 1 comprising a first sub-coil and a second sub-coil, and wherein the identification code of the combined main coil and sub-coil is four bits, and wherein the fixed resistance comprises a first fixed resistor, a second fixed resistor, a third fixed resistor, a fourth fixed resistor, a fifth fixed resistor, and a sixth fixed resistor, and wherein said adjusting resistance comprises a first adjusting resistor, a second adjusting resistor, a third adjusting resistor and said sixth fixed resistor;

said sub-coil switch comprising a first sub-coil switch, a second sub-coil switch and a third sub-coil switch;

a first field effect transistor, a second field effect transistor, a third field effect transistor, a fourth field effect transistor, a fifth field effect transistor, and a sixth field effect transistor, each of said first, second, third, fourth, fifth and sixth field effect transistors having a gate electrode, a source electrode and a drain electrode;

a first additional transistor that direct-current biases said first field effect transistor, a second additional resistor that direct-current biases said second field effect transistor, a third additional resistor that direct-current biases said third field effect transistor, a fourth additional resistor that direct-current biases said fourth field effect transistor and said fifth field effect transistor, and a fifth additional resistor that direct-current biases said sixth field effect transistor;

a first identification code power supply connected to one end of said third additional resistor and one end of said sixth fixed resistor, one end of the first adjusting resistor, one end of the fifth fixed resistor, and one end of the first additional resistor, respectively;

a second identification code power supply connected to one end of the fourth fixed resistor, one end of the third fixed resistor, and one end of the second additional resistor, respectively;

a third identification code power supply connected to one end of the first fixed resistor, and one end of the second adjusting resistor, respectively;

a fourth identification code power supply connected to one end of the second fixed resistor, one end of the third adjusting resistor, one end of the fourth additional resistor, and one end of the fifth additional resistor, respectively;

the gate of the first field effect transistor being connected to the other end of the first additional resistor, and one end of the first sub-coil switch, respectively, and the drain of the first field effect transistor being connected to the other end of the fifth fixed resistor;

the gate of the third field effect transistor being connected to the other end of the first additional resistor, and one end of the second sub-coil switch, and the drain of the third field effect transistor being connected to the other end of the sixth fixed resistor;

the gate of the second field effect transistor being connected to the other end of the second additional resistor, one end of the third sub-coil switch, and the gate of the sixth field effect transistor, and the drain of the second field effect transistor being connected to the other end of the third fixed resistor;

the gate of the fourth field effect transistor being connected to the other end of the fourth additional resistor and the gate of the twelfth field effect transistor, and the drain of the eleventh field effect transistor being connected to the other end of the second adjusting resistor;

the drain of the fifth field effect transistor being connected to the other end of the third adjusting resistor;

the gate of the sixth field effect transistor being connected to the other end of the fifth additional resistor, and the drain of the sixth field effect transistor being connected to the other end of the fourth additional resistor;

the other end of the first adjusting resistor, the other end of the fourth fixed resistor, the source of the first field effect transistor, the source of the second field effect transistor, the source of the third field effect transistor, the other end of the first sub-coil switch, and the other end of the second sub-coil switch being connected to ground; and the other end of the first fixed resistor, the other end of the second fixed resistor, the source of the fourth field effect transistor, the source of the fifth field effect transistor, the source of the sixth field effect transistor, and the other end of the third sub-coil switch being connected to ground.

7. An identification code circuit as claimed in claim 1 comprising a first sub-coil and a second sub-coil, and wherein the identification code of the combined main coil and sub-coil is one bit, and wherein said fixed resistance comprises a fixed resistor, said adjusting resistance comprises a first adjusting resistor and a second adjusting resistor, and said sub-coil switch comprises a first sub-coil switch and a second sub-coil switch, said identification code circuit further comprising:

an eleventh identification code power supply connected to one end of the fixed resistor, one end of the first sub-coil switch, and one end of the second sub-coil switch, respectively;

the other end of the first sub-coil switch being connected to the first adjusting resistor and the other end of the second sub-coil switch being connected to one end of the second adjusting resistor; and the other end of the fixed resistor, the other end of the first adjusting resistor and the other end of the second adjusting resistor being connected to ground.

8. An identification code circuit as claimed in claim 1 comprising a first sub-coil, a second sub-coil and a third sub-coil, and wherein the identification code of the combined main coil and sub-coil is two bits, and wherein said fixed resistance comprises a first fixed resistor and a second fixed resistor, and wherein said adjusting resistance comprises a first adjusting resistor, a second adjusting resistor and a third adjusting resistor, and wherein said sub-coil switch comprises a first sub-coil switch, a second sub-coil switch, and a third sub-coil switch, and wherein said identification code circuit further comprises:

a first identification code power supply connected to one end of the first fixed resistor, one end of the first sub-coil switch, and one end of the second sub-coil switch, respectively;

a second identification code power supply connected to one end of the second fixed resistor, and one end of the third sub-coil switch, respectively;

the other end of the first sub-coil switch being connected to one end of the first adjusting resistor, the other end of the second sub-coil switch being connected to one end of the third adjusting resistor; and the other end of the first fixed resistor, the other end of the second fixed resistor, the other end of the first adjusting resistor, the other end of the second adjusting resistor, and the other end of the third adjusting resistor being connected to ground.

* * * * *